United States Patent
Dunaway et al.

[11] Patent Number: 5,874,319
[45] Date of Patent: Feb. 23, 1999

[54] VACUUM DIE BOND FOR KNOWN GOOD DIE ASSEMBLY

[75] Inventors: Thomas J. Dunaway, New Hope; Deborah A. Cullinan, Plymouth, both of Minn.

[73] Assignee: Honeywell Inc., Minneapolis, Minn.

[21] Appl. No.: 651,065

[22] Filed: May 21, 1996

[51] Int. Cl.⁶ .................................................. H01L 21/66
[52] U.S. Cl. ................... 438/17; 435/14; 435/15
[58] Field of Search ................................ 437/8, 209, 220; 324/755, 758, 765; 438/14, 15, 17

[56] References Cited

U.S. PATENT DOCUMENTS

| | | | |
|---|---|---|---|
| 3,777,365 | 12/1973 | Umbaugh | 437/206 |
| 3,811,182 | 5/1974 | Ryan, Sr. et al. | 29/574 |
| 4,881,885 | 11/1989 | Kovac et al. | 437/209 |
| 4,932,883 | 6/1990 | Hsia et al. | 439/66 |
| 5,147,821 | 9/1992 | McShane et al. | 437/214 |
| 5,173,451 | 12/1992 | Kinsman et al. . | |
| 5,203,401 | 4/1993 | Hamburgen et al. | 165/80.5 |
| 5,237,269 | 8/1993 | Aimi et al. | 437/8 |
| 5,322,207 | 6/1994 | Fogal et al. . | |
| 5,336,649 | 8/1994 | Kinsman et al. . | |
| 5,367,253 | 11/1994 | Wood et al. . | |
| 5,378,981 | 1/1995 | Higgins, III | 324/765 |
| 5,424,652 | 6/1995 | Hembree et al. . | |
| 5,459,351 | 10/1995 | Bender . | |
| 5,474,958 | 12/1995 | Djennas et al. | 437/220 |
| 5,475,317 | 12/1995 | Smith . | |
| 5,489,538 | 2/1996 | Rostoker et al. | 437/8 |
| 5,548,884 | 8/1996 | Kim | 437/183 |
| 5,568,057 | 10/1996 | Kim et al. | 437/8 |
| 5,589,781 | 12/1996 | Higgins et al. | 324/755 |
| 5,591,649 | 1/1997 | Arnold et al. | 437/8 |

*Primary Examiner*—John Niebling
*Assistant Examiner*—Kevin F. Turner
*Attorney, Agent, or Firm*—Gregory A. Bruns

[57] ABSTRACT

Method for testing bare semiconductor die which includes providing a test substrate with a die receiving surface and bond pads with conductive traces which extend away from the surface and are connected to leads that may be contacted with test probes. A vacuum source is applied to an aperture in the die receiving surface. Atmospheric pressure holds the die in place during the connection of thin wires. After connection, the die is held in place during testing by the thin wires.

4 Claims, 1 Drawing Sheet

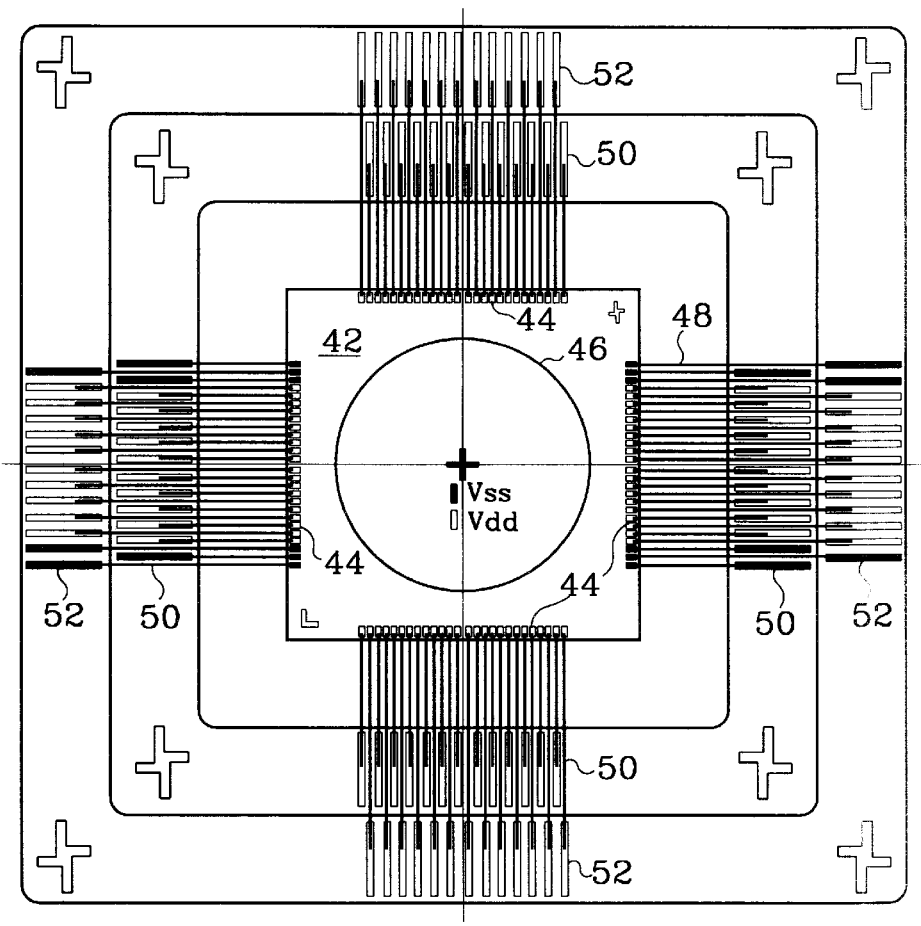
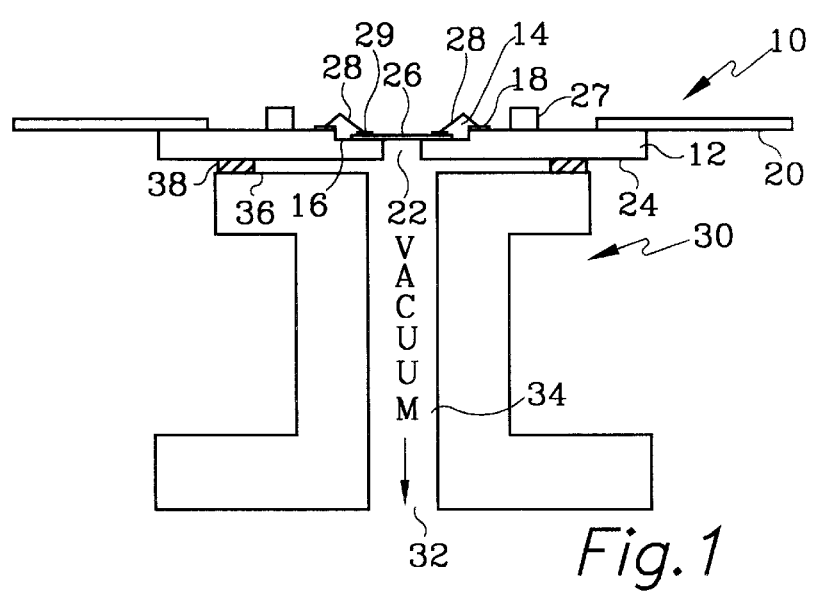
Fig.2
Fig.3
Fig.1

VACUUM DIE BOND FOR KNOWN GOOD DIE ASSEMBLY

BACKGROUND OF THE INVENTION

The present invention relates to full finctional testing of integrated circuit (IC) devices before assembly and particularly to a reusable device for making connections to singulated bare die.

There is an interest in performing full functional testing of unpackaged semiconductor die prior to packaging. This is due in part to the cost associated with packaging even singular IC devices. However, in addition to singular IC devices there is increased interest in full functional testing of individual IC devices before the individual devices are assembled into multi-chip modules (MCMs).

IC devices may be tested as follows. A semiconductor die is placed in a test chip package, e.g., a dual in-line package or a hermetic leaded chip carrier such as a flatpack, and die bonded by a temporary means. Thin wires are then connected from bond pads on the chip to leads in the chip package. The connections are typically made by wire bonding. The connections at the bond pads on the chip may be made in a way that results in a low strength bond. After the testing has been performed a force is applied to the wire to remove it from the bond pad on the chip, the die is then removed from the test package and subsequently packed in a production process.

U.S. patent application Ser. No. 08/591,365 entitled "Test and Tear Away Bond Pad Design" having a filing date of Jan. 25, 1996, and U.S. Patent Application entitled "Method for Providing a Test Connection and a Permanent Connection Site on an Unpackaged Semiconductor Die", filed Apr. 26, 1996 (Ser. No. 08/638,420), both of which as assigned to Honeywell Inc., are hereby incorporated by reference.

A known bare die testing method includes placing a bare die in a package or chip carrier and securing it there by temporary die bonding means, making temporary electrical connections from bond pads on the die to contact pads or leads on the carrier, and connecting external test equipment to leads on the carrier to perform electrical tests on the die. When the tests are completed, the die is removed from the carrier. Various means have been proposed for making the temporary die bond. For example, the use of a pre-cured RTV silicone strip commonly known as gel pack has been proposed for temporarily securing the die in place within a package body. The strip exhibits a surface static charge and coefficient of friction sufficient to hold the die in place without adhesive. A water soluble wax die bond has been used to secure the die to the package. Water soluble wax was found to be difficult to clean and the contamination also affected subsequent production wire bonding. An alternative technique utilizes a tape type die attach adhesive sold be E.I. DuPont deNemours of Wilmington, Del., under the trademark Kapton QA DuAttach Adhesive. The QL adhesive is heated, but for a shorter period of time than for permanently packaged die. The results in a lower strength which can be readily overcome when the testing is complete and the die is to be removed from the carrier.

In addition, it has been proposed to use a solution of sugar and water as a die attach adhesive. The technique would involve placing a drop of sugar and water on the package body or backside of the die and placing the die on the package. Surface tension would then retain the die in the package body until sufficient water evaporates to cause the die to be bonded to the package. Subsequent to testing, the package body would be placed in deionized water to free the die.

All of the methods for temporary die bonding just described are difficult to incorporate into a production process and include some contamination problems. All of these methods require some amount of clean-up which results in time inefficiency.

There is also a need for a test package that is reusable. The cost of test packages presently being used is significant if they are not reusable. The contamination problems associated with temporary die bonding methods make it more difficult to reuse the test packages.

Thus, a need exists for a simple and reliable method of providing temporary die bonding for testing purposes in a reusable package that is free of contamination problems.

SUMMARY OF THE INVENTION

The present invention solves these and other needs by providing a method for testing bare semiconductor die which includes providing a test substrate with a die receiving surface and bond pads with conductive traces which extend away from the surface and are connected to leads that may be contacted with test probes. A vacuum source is applied to an aperture in the die receiving surface. Atmospheric pressure holds the die in place during connection of thin wires. After connection, the die is held in place during testing by the thin wires. The vacuum source may be used to hold the bare die in place during both the connection of the thin wires and the removal of the thin wires

BRIEF DESCRIPTION OF THE DRAWINGS

FIG. 1 is an elevation drawing of a device according to the principles of the present invention.

FIG. 2 is a plan view of a portion of a device according to the principles of the present invention.

FIG. 3 is a plan view of a bond pad according to the principles of the present invention.

DETAILED DESCRIPTION OF THE INVENTION

A reusable testing device for temporarily holding an unpackaged semiconductor die in place while operations are performed on the die is shown in the drawings and is generally designated 10.

Device 10 may be constructed by starting with any one of a variety of package types. For illustration purposes, a leaded chip carrier or flat pack is shown. Device 10 includes a body 12 having a cavity 14 having a surface 16 for receiving a semiconductor die 26. Bonds or contacts 18 located on device 10 are connected to conductive paths (not shown) within body 12 which extend to leads 20 to form connections to external test equipment according to conventional practice.

Device 10 includes an aperture 22 extending from surface 16 of cavity 14 through body 12 to the exterior 24 of body 12. For certain package types device 10 may include a seal ring 27. Device 10 is used in conjunction with a vacuum pedestal 30 which may be of the type available from Kulicke and Soffa for use with a wire bonding machine. Vacuum pedestal 30 includes a connection at 32 for attaching pedestal 30 to a source of vacuum, a passageway 34 and a surface 36 for placing a device to be held in place. A gasket 38 or sealing means is located between surface 36 of pedestal 30 and surface 24 of device 10.

FIG. 2 shows a top view of only a central portion 40 of a ceramic chip carrier having a die receiving surface 42. Die 43 includes bond pads 44. Pads 44 have conductors 48 extending to two rows of pads 50 and 52 which have conductive traces (not shown) within the carrier which extend away from surface 42 and are connected to leads similar to lead 20 of FIG. 1. Surface 42 includes aperture or hole 46 which extends to an exterior of carrier 40. Hole 46 may be formed by laser cutting means. FIG. 2 corresponds roughly to the portion of device 10 located inside seal ring 27 of FIG. 1.

Now that the base construction of device 10 has been set forth, the method of use will be described. For example, if testing is typically performed in lots of 50, then when a lot of 50 die are to be tested, 50 of device 10 would be prepared and a wire bond machine would be set up to bond to a selected location on bond pad 18. For example, as shown in FIG. 3, a bond pad 60 having a width, w, of 8 mils could accommodate three bonds have a width of 1.5 mils per row. The first lot of 1–50 die would be tested using the upper left bonding location 62 and the next lot of 51–100 would be tested using bond location 64 which is one space to the right.

Die 26 would be placed in cavity 14 over aperture 22 and device 10 would be placed on vacuum pedestal 30. With a reduced pressure or vacuum present in passage 34, device 10 and die 26 located on device 10 will be held in place by normal atmospheric pressure exerted on the upper surface of device 10 and die 26. Thin wires 28 may then be connected by wirebonds. Thin wires 28 will extend, for example, from pad 29 on die 26 to bond pad 18 on device 10.

Device 10 then is removed from vacuum pedestal 30 and die 26 is held in place by thin wires 28. A test probe arrangement is used to contact lead 20, for example, to perform the required testing.

When testing is completed, device 10 may again be placed on vacuum pedestal 30 and thin wires 28 removed. The wires may be removed automatically by the use of a wire bond machine or they may be removed manually by the use of a hand tool.

The scope of the present invention is to be limited by the appended claims rather than by the foregoing description.

We claim:

1. Method for testing bare semiconductor die comprising the following steps:

providing a first semiconductor die;

providing a reusable test substrate having a surface for receiving said semiconductor die, said substrate having a plurality of bond pads having conductive traces extending away from said surface and terminating in test connections said surface having an aperture extending to an exterior;

applying a vacuum force to said aperture at said exterior;

placing said first die on said surface with said die being held at said surface by said vacuum force;

connecting thin wires from said first die to a first location on selected ones of said plurality of bond pads; with said first location selected to allow space for a plurality of future connections;

removing said vacuum force with said first die then being held in place by said thin wires, performing an electrical test on said die using selected ones of said test connections;

removing said thin wires from said first die;

providing a second semiconductor die;

applying a vacuum force to said aperture at said exterior;

placing said second die on said surface; and connecting thin wires from said second die to a second location, spaced from the first location, on said selected ones of said plurality of bond pads.

2. Method of claim 1 wherein said step of removing said wires from said die includes the step of applying a vacuum force to said aperture at said exterior.

3. Method for testing bare semiconductor die comprising the following steps:

providing a first semiconductor die;

providing a reusable test substrate having a surface for receiving said semiconductor die, said substrate having a plurality of bond pads having conductive traces extending away from said surface and terminating in test connections, said surface having an aperture extending to an exterior;

applying a vacuum force to said aperture at said exterior;

placing said first die on said surface with said die being held at said surface by said vacuum force;

connecting thin wires from said first die to a first location on selected ones of said plurality of bond pads, with said first location selected to allow for a plurality of future connections at other locations spaced from said first location;

removing said vacuum force with said first die then being held in place by said thin wires;

performing an electrical test on said die using selected ones of said test connections;

removing said thin wires from said first die.

4. The method of claim 3 wherein said step of removing said wires from said die includes the step of applying a vacuum force to said aperture at said exterior.

* * * * *